(12) United States Patent
Sawada et al.

(10) Patent No.: US 11,019,732 B2
(45) Date of Patent: May 25, 2021

(54) PRINTED WIRING BOARD AND METHOD FOR MANUFACTURING THE SAME

(71) Applicant: IBIDEN CO., LTD., Ogaki (JP)

(72) Inventors: Yoji Sawada, Ogaki (JP); Shuto Iwata, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/004,812

(22) Filed: Aug. 27, 2020

(65) Prior Publication Data

US 2021/0068265 A1 Mar. 4, 2021

(30) Foreign Application Priority Data

Aug. 30, 2019 (JP) ............................. JP2019-157653

(51) Int. Cl.
*H05K 1/11* (2006.01)
*H05K 3/34* (2006.01)
*H05K 3/12* (2006.01)
*H05K 3/42* (2006.01)

(52) U.S. Cl.
CPC ........... *H05K 3/3473* (2013.01); *H05K 1/113* (2013.01); *H05K 3/1258* (2013.01); *H05K 3/3452* (2013.01); *H05K 3/429* (2013.01)

(58) Field of Classification Search
CPC .............. H05K 1/11–119; H05K 3/3457–3485
See application file for complete search history.

(56) References Cited

FOREIGN PATENT DOCUMENTS

JP 2019-054111 A 4/2019

*Primary Examiner* — Jeremy C Norris
(74) *Attorney, Agent, or Firm* — Oblon, McClelland, Maier & Neustadt, L.L.P.

(57) ABSTRACT

A printed wiring board includes an insulating layer, a conductor layer formed on the insulating layer and including first and second pads, a solder resist layer formed on the insulating layer, covering the conductor layer and exposing the first and second pads to form the second pad having diameter smaller than diameter of the first pad, a first bump formed on the first pad and including first base and top plating layers such that the first base layer has embedded portion in the resist layer and exposed portion and having diameter substantially equal to or smaller than diameter of the embedded portion, and a second bump formed on the second pad and including second base and top plating layers such that the second base layer has embedded portion in the resist layer and exposed portion and having diameter substantially equal to or smaller than diameter of the embedded portion.

20 Claims, 3 Drawing Sheets

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2019-157653, filed Aug. 30, 2019, the entire contents of which are incorporated herein by reference.

BACKGROUND OF THE INVENTION

Field of the Invention

The present invention relates to a printed wiring board having plating bumps and a method for manufacturing the printed wiring board.

Description of Background Art

In Japanese Patent Application Laid-Open Publication No. 2019-54111, in a printed wiring board, bumps of different sizes are respectively formed on conductor pads in openings of different sizes formed in a solder resist layer on a base insulating layer, the bumps being each formed by forming a base plating layer formed of Cu as a metal post and forming a top plating layer formed of Sn on the base plating layer. The entire contents of this publication are incorporated herein by reference.

SUMMARY OF THE INVENTION

According to one aspect of the present invention, a printed wiring board includes a base insulating layer, a conductor layer formed on the base insulating layer and including a first conductor pad and a second conductor pad, a solder resist layer formed on the base insulating layer such that the solder resist layer is covering the conductor layer formed on the base insulating layer and exposing the first and second conductor pads to form the second conductor pad having a diameter smaller than a diameter of the first conductor pad, a first bump formed on the first conductor pad and including a first base plating layer and a first top plating layer formed on the first base plating layer such that the first base plating layer has an embedded portion embedded in the solder resist layer and an exposed portion exposed from the solder resist layer and having a diameter substantially equal to or smaller than a diameter of the embedded portion, and a second bump formed on the second conductor pad and including a second base plating layer and a second top plating layer formed on the second base plating layer such that the second bump has a diameter smaller than a diameter of the first bump and that the second base plating layer has an embedded portion embedded in the solder resist layer and an exposed portion exposed from the solder resist layer and having a diameter substantially equal to or smaller than a diameter of the embedded portion.

According to another aspect of the present invention, a method for manufacturing a printed wiring board includes forming a conductor layer including a first conductor pad and a second conductor pad on a base insulating layer on a base insulating layer, forming a dry film resist layer on the base insulating layer such that the dry film resist layer is covering the conductor layer formed on the base insulating layer, forming a first opening exposing the first conductor pad and a second opening having a smaller diameter than a diameter of the first opening and exposing the second conductor pad, applying first metal plating such that a first base plating layer is formed on the first conductor pad in the first opening and that a second base plating layer is formed on the second conductor pad in the second opening, applying second metal plating such that a first top plating layer is formed on the first base plating layer in the first opening to form a first bump post including the first base plating layer and the first top plating layer and that a second top plating layer is formed on the second base plating layer in the second opening to form a second bump post including the second base plating layer and the second top plating layer, removing the dry film resist layer from the base insulating layer on which the first bump post is formed on the first conductor pad of the conductor layer and the second bump post is formed on the second conductor pad of the conductor layer, forming a solder resist layer on the base insulating layer such that the solder resist layer covers the first bump post formed on the first conductor pad of the conductor layer and the second bump post formed on the second conductor pad of the conductor layer, and thinning the solder resist layer over an entire surface of the solder resist layer such that the first top plating layer of the first bump post and the second top plating layer of the second bump post are positioned outside the solder resist layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
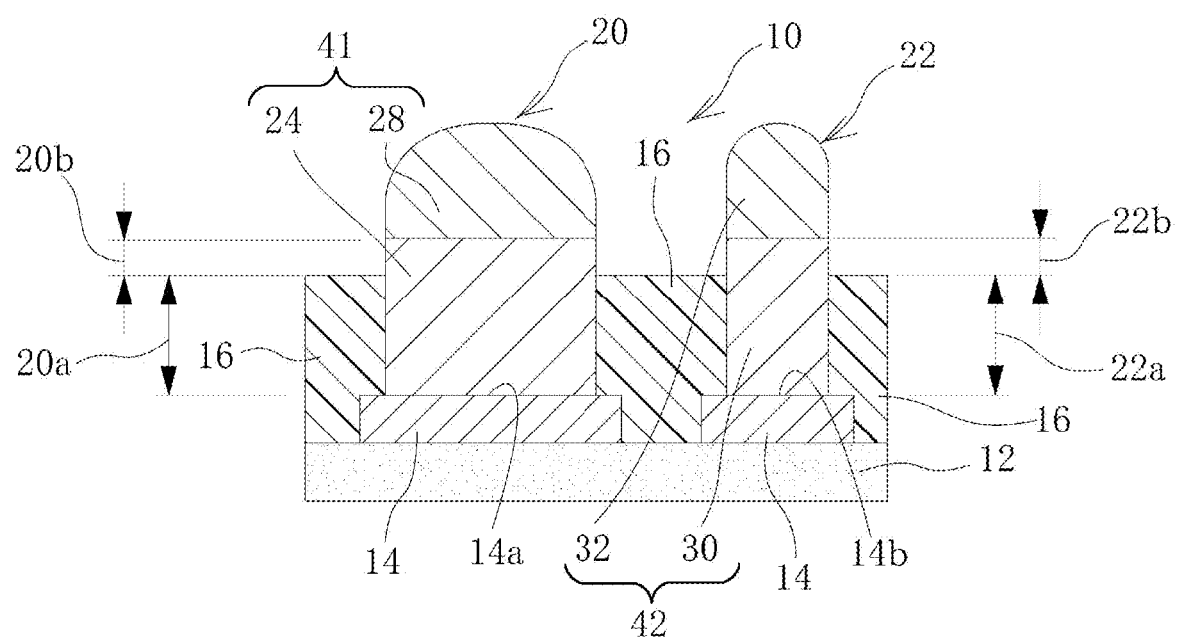
FIG. 1 is a cross-sectional view for describing a printed wiring board according to an embodiment of the present invention.

Embodiments will now be described with reference to the accompanying drawings, wherein like reference numerals designate corresponding or identical elements throughout the various drawings.

FIG. 1 illustrates an enlarged view of a portion of a printed wiring board 10 according to an embodiment of the present invention. The printed wiring board 10 may be a substrate with a core formed by alternately laminating conductor layers and resin insulating layers on one side or both sides of a core substrate (not illustrated in the drawings), the conductor layers each having a predetermined circuit pattern. In the case where the conductor layers are formed on both sides of the core substrate, conductor layers opposing each other via the core substrate may be connected to each other via through-hole conductors (not illustrated in the drawings). Alternatively, the printed wiring board 10 may be a coreless substrate obtained by alternately laminating conductor layers and resin insulating layers on a support plate (not illustrated in the drawings) instead of a core substrate, and then removing the support plate. In any case, as illustrated in FIG. 1, the printed wiring board 10 includes at least a base insulating layer 12 which is positioned outermost among the resin insulating layers, a conductor layer 14 which is formed on the base insulating layer 12 and has a predetermined circuit pattern, and a solder resist layer 16 which is formed on the base insulating layer 12 and the conductor layer 14. Other multiple conductor layers and multiple resin insulating layers are often alternately provided below the base insulating layer 12, but are omitted in the drawings. However, it is also possible that the printed wiring board 10 is formed of one insulating layer (the base insulating layer 12) and one conductor layer (the conductor layer 14).

A first conductor pad (14a) is set at a center portion of the conductor layer 14 where a large-diameter bump is to be formed. A cylindrical first base plating layer 24 is formed on the first conductor pad (14a), and a first top plating layer 28 is formed on the first base plating layer 24. A first bump post 41 is formed by the first base plating layer 24 and the first top plating layer 28.

A second conductor pad (14b) having a smaller diameter than the first conductor pad (14a) is set at a center portion of the conductor layer 14 where a small-diameter bump is to be formed. A cylindrical second base plating layer 30 having a smaller diameter than the first base plating layer 24 is formed on the second conductor pad (14b), and a second top plating layer 32 is formed on the second base plating layer 30. A second bump post 42 is formed by the second base plating layer 30 and the second top plating layer 32.

As illustrated in FIG. 1, a solder resist layer 16 is provided on the base insulating layer 12, between outer peripheral portions of the conductor layer 14, and between the first bump post 41 and the second bump post 42 and further on them. By a reflow treatment, head portions of the first top plating layer 28 and the second top plating layer 32 are melted and shaped into substantially hemispherical shapes. As a result, a printed wiring board 10 having a large-diameter first bump 20 and a small-diameter second bump 22 is formed.

Details of the parts of the printed wiring board illustrated in FIG. 1 described above are as follows.

The base insulating layer 12 can be formed of, for example, a resin composition or the like containing an inorganic filler such as silica or alumina and an epoxy resin. The conductor layer 14 is formed of a conductive metal, for example, a metal containing copper as a main component.

An underlayer may be formed on each of the first and second conductor pads (14a, 14b). As the underlayer, a nickel layer formed on a surface of each of the first and second conductor pads (14a, 14b), a palladium layer formed on the nickel layer, and a gold layer formed on the palladium layer can be exemplified. In addition, a nickel layer and a gold layer formed on the nickel layer can be exemplified.

The printed wiring board 10 according to the embodiment of the present invention has the first bump 20 and the second bump 22 which has a smaller diameter than the first bump 20. The first bump 20 can be used for connecting to a power source or a ground line.

The second bump 22 having a smaller diameter than the first bump 20 can be used for connecting to a signal line.

An intermediate layer containing, for example, nickel as a main component can be provided between the first base plating layer 24 and the first top plating layer 28 which form the first bump 20 and between the second base plating layer 30 and the second top plating layer 32 which form the second bump 22.

The first base plating layer 24 and the second base plating layer 30 are each formed of a conductive metal, preferably a metal containing copper as a main component. The first base plating layer 24 and the second base plating layer 30 are preferably each formed to a height exceeding a surface of the solder resist layer 16 (a surface on an opposite side with respect to the base insulating layer 12).

The first top plating layer 28 and the second top plating layer 32 are each formed of a metal which has a lower melting point than the first base plating layer 24 and the second base plating layer 30 and which is melted by a reflow treatment and is shaped into a substantially hemispherical shape as illustrated in FIG. 1, for example, a metal containing tin as a main component.

In the above-described printed wiring board according to the embodiment of the present invention, the first bump 20 has an embedded portion (20a) embedded in the solder resist layer 16 and an exposed portion (20b) exposed from the solder resist layer 16 (in the example of FIG. 1, the embedded portion (20a) and a portion of the exposed portion (20b) are in the first base plating layer 24), and a diameter of the embedded portion (20a) and a diameter of the exposed portion (20b) are substantially the same. Further, the second bump 22 has an embedded portion (22a) embedded in the solder resist layer 16 and an exposed portion (22b) exposed from the solder resist layer 16 (in the example of FIG. 1, the embedded portion (22a) and a portion of the exposed portion (22b) are in the second base plating layer 30), and a diameter of the embedded portion (22a) and a diameter of the exposed portion (22b) are substantially the same.

Therefore, according to the above-described printed wiring board in the embodiment of the present invention, since the embedded portion (20a) and the exposed portion (20b) of the first bump 20 have substantially the same diameter and the embedded portion (22a) and the exposed portion (22b) of the second bump 22 have substantially the same diameter, first bumps and second bumps can be formed at high densities. Further, according to a method for manufacturing a printed wiring board according to an embodiment of the present invention to be described later, as compared to a case of where an opening is sequentially formed for each bump using laser, it is not necessary to form an opening in a solder resist for each bump, and thus, productivity is improved.

In the following, a method for manufacturing the printed wiring board 10 illustrated in FIG. 1 is described with reference to FIGS. 2A-2G.

Figure 2A:
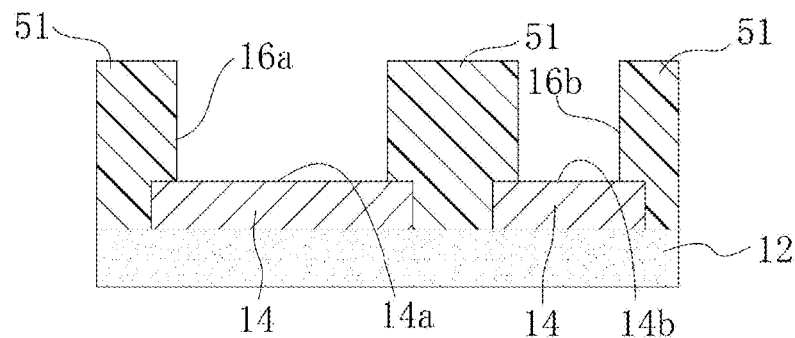
FIG. 2A is a cross-sectional view illustrating a method for manufacturing a printed wiring board according to an embodiment of the present invention.

First, as illustrated in FIG. 2A, the conductor layer 14 having a predetermined circuit pattern is formed on the base insulating layer 12, and a dry film resist layer 51 is formed on the conductor layer 14 and the base insulating layer 12, and, in a state in which a mask is formed at a position where openings of the dry film resist layer 51 can be formed, for example, by UV exposure, a first opening (16a) on the first conductor pad (14a) of the conductor layer 14 where a large-diameter bump is to be formed and a second opening (16b) on the second conductor pad (14b) of the conductor layer 14 where a small-diameter bump is to be formed are formed in the dry film resist layer 51. An aspect ratio of the first opening (16a), that is, a ratio of a depth to a diameter at a bottom thereof can be set to 0.5 or less. An aspect ratio of the second opening (16b), that is, a ratio of a depth to a diameter at a bottom thereof can be set to 0.6 or more.

Figure 2B:
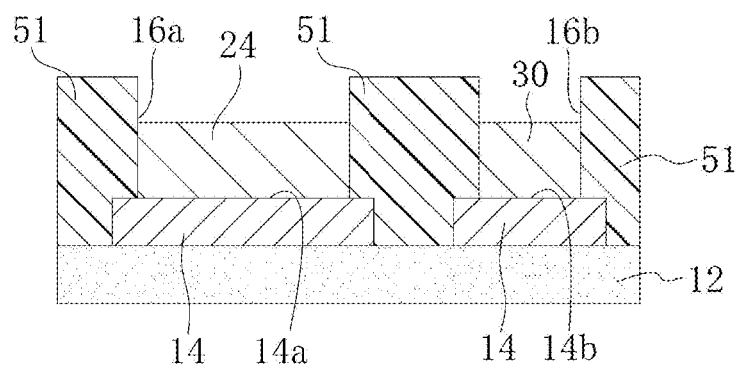
FIG. 2B is a cross-sectional view illustrating the method for manufacturing the printed wiring board according to the embodiment of the present invention.

Next, as illustrated in FIG. 2B, an electrolytic copper plating treatment is performed in the first opening (16a) and the second opening (16b) of the dry film resist layer 51, and the first base plating layer 24 and the second base plating layer 30 each formed of copper are respectively formed on the first conductor pad (14a) and the second conductor pad (14b). When it is not possible for the first base plating layer 24 and the second base plating layer 30 to have predetermined heights by performing a plating process once, the plating process is repeated two or more times.

Figure 2C:
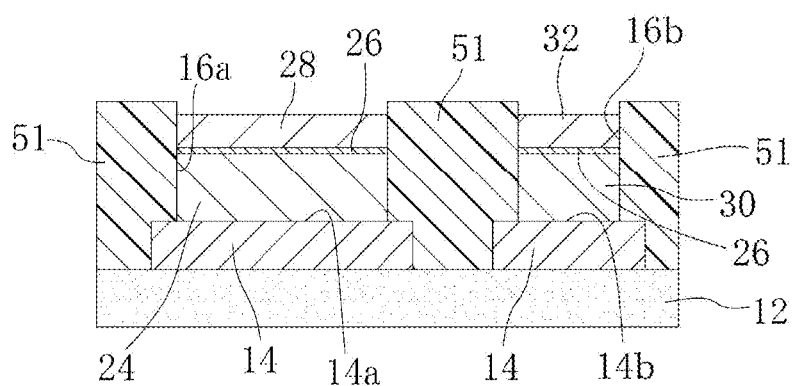
FIG. 2C is a cross-sectional view illustrating the method for manufacturing the printed wiring board according to the embodiment of the present invention.

As illustrated in FIG. 2C, an electrolytic Ni plating treatment and an electrolytic Sn plating treatment are performed with respect to the first base plating layer 24 and the second base plating layer 30 in the first opening (16a) and the second opening (16b), and the first top plating layer 28 and the second top plating layer 32 each formed of Sn are respectively formed on the first base plating layer 24 and the second base plating layer 30 via an intermediate layer 26 formed of Ni.

Figure 2D:
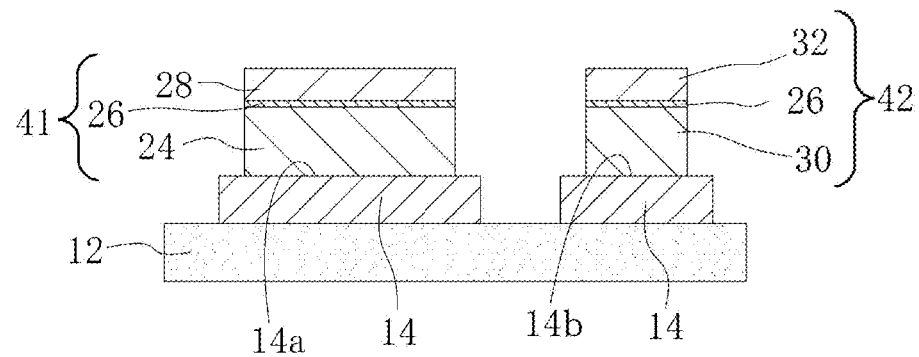
FIG. 2D is a cross-sectional view illustrating the method for manufacturing the printed wiring board according to the embodiment of the present invention.

As illustrated in FIG. 2D, the dry film resist layer 51 is removed. As a result, the first bump post 41 including the first base plating layer 24, the intermediate layer 26 and the first top plating layer 28 is formed on the first conductor pad (14a), and the second bump post 42 including the second base plating layer 30, the intermediate layer 26 and the second top plating layer 32 is formed on the second conductor pad (14b).

Figure 2E:
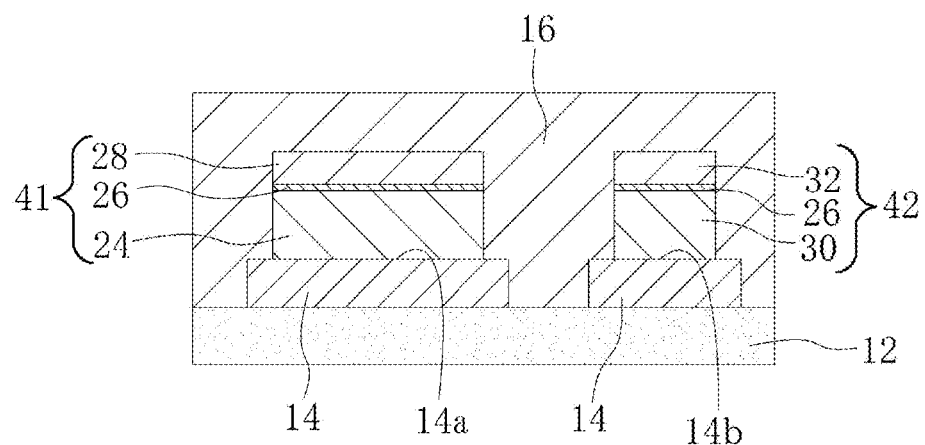
FIG. 2E is a cross-sectional view illustrating the method for manufacturing the printed wiring board according to the embodiment of the present invention.

As illustrated in FIG. 2E, the solder resist layer 16 is formed on the base insulating layer 12, between outer peripheral portions of the conductor layer 14, and between the first bump post 41 and the second bump post 42 and further on them.

Figure 2F:
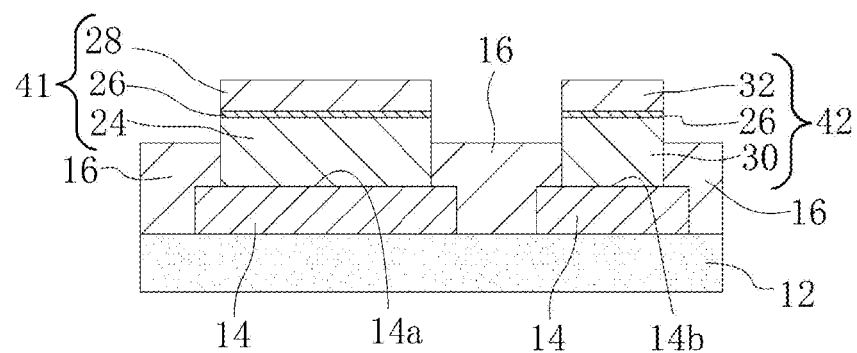
FIG. 2F is a cross-sectional view illustrating the method for manufacturing the printed wiring board according to the embodiment of the present invention.

As illustrated in FIG. 2F, a plasma treatment is performed on the solder resist layer 16 to thin the solder resist layer 16 over an entire surface thereof. As a result, the first top plating layer 28 and an upper portion of the first base plating layer 24 of the first bump post 41 and, the second top plating layer 32 and an upper portion of the second base plating layer 30 of the second bump post 42, are positioned on an outer side of an upper surface of the solder resist layer 16. After that, the first top plating layer 28 and the second top plating layer 32 are subjected to a reflow treatment, and the printed wiring board 10 as illustrate in FIG. 1 having the first bump 20 and the second bump 22 each having a hemispherical head can be obtained.

The plasma treatment described above can be performed using $CF_4$ or $CF_4+O_2$. Further, after the solder resist layer 16 is thinned over the entire surface thereof, residues left by the plasma treatment can be removed by a wet blast treatment.

According to the above-described method for manufacturing the printed wiring board, the openings are not formed using laser, and the first bump post 41 and the second bump post 42 are formed by plating in the openings formed by exposure in the dry film resist layer. Therefore, of the first bump 20, the embedded portion (20a) embedded in the solder resist layer 16 and the exposed portion (20b) exposed from the solder resist layer 16 (in the example of FIG. 1, the embedded portion (20a) and a portion of the exposed portion (20b) are in the first base plating layer 24) have substantially the same diameter. Further, the second bump 22 has an embedded portion (22a) embedded in the solder resist layer 16 and an exposed portion (22b) exposed from the solder resist layer 16 (in the example of FIG. 1, the embedded portion (22a) and a portion of the exposed portion (22b) are in the second base plating layer 30), and a diameter of the embedded portion (22a) and a diameter of the exposed portion (22b) are substantially the same. As a result, a printed wiring board according to an embodiment of the present invention can be obtained.

In Japanese Patent Application Laid-Open Publication No. 2019-54111, in each of the base plating layers forming the metal posts of different sizes, a diameter of an exposed portion formed to be exposed to an outer side of the solder resist layer is larger than a diameter of an embedded portion formed to be embedded inside an opening. Therefore, there is a problem that it is difficult to form the metal posts at a high density.

A printed wiring board according to an embodiment of the present invention includes: a base insulating layer; a conductor layer that is formed on the base insulating layer and includes a first conductor pad and a second conductor pad, the second conductor pad having a smaller diameter than the first conductor pad; a solder resist layer formed on the base insulating layer and on the conductor layer; a first bump formed on the first conductor pad; and a second bump formed on the second conductor pad, the second bump having a smaller diameter than the first bump. The first bump has a first base plating layer and a first top plating layer formed on the first base plating layer. The second bump has a second base plating layer and a second top plating layer formed on the second base plating layer. The first base plating layer in the first bump has an embedded portion embedded in the solder resist layer and an exposed portion exposed from the solder resist layer, and a diameter of the embedded portion and a diameter of the exposed portion are substantially the same. The second base plating layer in the second bump has an embedded portion embedded in the solder resist layer and an exposed portion exposed from the solder resist layer, and a diameter of the embedded portion and a diameter of the exposed portion are substantially the same.

A method for manufacturing a printed wiring board according to an embodiment of the present invention includes: forming a base insulating layer; forming a conductor layer on the base insulating layer; forming a dry film resist layer on the base insulating layer and on the conductor layer; simultaneously forming, in the dry film resist layer by exposure, a first opening exposing a portion of the conductor layer as a first conductor pad and a second opening exposing another portion of the conductor layer as a second conductor pad, the second opening having a smaller diameter than the first opening; by performing first metal plating in the first opening and the second opening, forming a first base plating layer on the conductor layer in the first opening and forming a second base plating layer on the conductor layer in the second opening; by performing second metal plating in the first opening and the second opening, forming a first top plating layer on the first base plating layer in the first opening to form a first bump post, and forming a second top plating layer on the second base plating layer in the second opening to form a second bump post; removing the dry film resist layer; forming a solder resist layer on the base insulating layer and on the first bump post and the second bump post; and thinning the solder resist layer over an entire surface thereof by performing a plasma treatment such that the first top plating layer of the first bump post and the second top plating layer of the second bump post are positioned on an outer side of the solder resist layer.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a base insulating layer;
a conductor layer formed on the base insulating layer and including a first conductor pad and a second conductor pad;
a solder resist layer formed on the base insulating layer such that the solder resist layer is covering the conductor layer formed on the base insulating layer and exposing the first and second conductor pads to form the second conductor pad having a diameter smaller than a diameter of the first conductor pad;
a first bump formed on the first conductor pad and comprising a first base plating layer and a first top plating layer formed on the first base plating layer such that the first base plating layer has an embedded portion embedded in the solder resist layer and an exposed portion exposed from the solder resist layer and having a diameter substantially equal to or smaller than a diameter of the embedded portion; and
a second bump formed on the second conductor pad and comprising a second base plating layer and a second top plating layer formed on the second base plating layer such that the second bump has a diameter smaller than a diameter of the first bump and that the second base plating layer has an embedded portion embedded in the solder resist layer and an exposed portion exposed from the solder resist layer and having a diameter substantially equal to or smaller than a diameter of the embedded portion.

2. The printed wiring board according to claim 1, wherein each of the first base plating layer and the second base plating layer comprises metal including copper such that copper is a main component of the metal in each of the first base plating layer and the second base plating layer.

3. The printed wiring board according to claim 2, wherein each of the first top plating layer and the second top plating layer comprises metal including tin such that tin is a main component of the metal in each of the first top plating layer and the second top plating layer.

4. The printed wiring board according to claim 2, wherein the solder resist layer has a flat upper surface.

5. The printed wiring board according to claim 1, wherein each of the first top plating layer and the second top plating layer comprises metal including tin such that tin is a main component of the metal in each of the first top plating layer and the second top plating layer.

6. The printed wiring board according to claim 1, wherein the solder resist layer has a flat upper surface.

7. The printed wiring board according to claim 1, wherein the first bump is formed such that the exposed portion has the diameter substantially equal to the diameter of the embedded portion, and the second bump is formed such that the exposed portion has the diameter substantially equal to the diameter of the embedded portion.

8. The printed wiring board according to claim 7, wherein each of the first base plating layer and the second base plating layer comprises metal including copper such that copper is a main component of the metal in each of the first base plating layer and the second base plating layer.

9. The printed wiring board according to claim 7, wherein each of the first top plating layer and the second top plating layer comprises metal including tin such that tin is a main component of the metal in each of the first top plating layer and the second top plating layer.

10. The printed wiring board according to claim 7, wherein the solder resist layer has a flat upper surface.

11. A method for manufacturing a printed wiring board, comprising:
forming a conductor layer including a first conductor pad and a second conductor pad on a base insulating layer;
forming a dry film resist layer on the base insulating layer such that the dry film resist layer is covering the conductor layer formed on the base insulating layer;
forming a first opening exposing the first conductor pad and a second opening having a smaller diameter than a diameter of the first opening and exposing the second conductor pad;
applying first metal plating such that a first base plating layer is formed on the first conductor pad in the first opening and that a second base plating layer is formed on the second conductor pad in the second opening;
applying second metal plating such that a first top plating layer is formed on the first base plating layer in the first opening to form a first bump post comprising the first base plating layer and the first top plating layer and that a second top plating layer is formed on the second base plating layer in the second opening to form a second bump post comprising the second base plating layer and the second top plating layer;
removing the dry film resist layer from the base insulating layer on which the first bump post is formed on the first conductor pad of the conductor layer and the second bump post is formed on the second conductor pad of the conductor layer;
forming a solder resist layer on the base insulating layer such that the solder resist layer covers the first bump post formed on the first conductor pad of the conductor layer and the second bump post formed on the second conductor pad of the conductor layer; and
thinning the solder resist layer over an entire surface of the solder resist layer such that the first top plating layer of the first bump post and the second top plating layer of the second bump post are positioned outside the solder resist layer.

12. The method for manufacturing a printed wiring board according to claim 11, further comprising:
applying a reflow treatment to the first top plating layer and the second top plating layer such that a first bump having a hemispherical head and a second bump having a hemispherical head are formed.

13. The method for manufacturing a printed wiring board according to claim 11, wherein the thinning of the solder resist layer comprises applying a plasma treatment to the solder resist layer such that an upper portion of the first base plating layer and an upper portion of the second base plating layer are positioned on an outer side of the solder resist layer.

14. The method for manufacturing a printed wiring board according to claim 13, further comprising:
applying a wet blast treatment after the thinning of the solder resist layer such that residues left by the plasma treatment is removed from the solder resist layer.

15. The method for manufacturing a printed wiring board according to claim 11, further comprising:
applying a wet blast treatment after the thinning of the solder resist layer such that residues left by the thinning is removed from the solder resist layer.

16. The method for manufacturing a printed wiring board according to claim 11, wherein the plasma treatment includes use of $CF_4$ or $CF_4+O_2$.

17. The method for manufacturing a printed wiring board according to claim 11, wherein each of the first base plating layer and the second base plating layer comprises metal including copper such that copper is a main component of the metal in each of the first base plating layer and the second base plating layer.

18. The method for manufacturing a printed wiring board according to claim 17, wherein each of the first top plating layer and the second top plating layer comprises metal including tin such that tin is a main component of the metal in each of the first top plating layer and the second top plating layer.

19. The method for manufacturing a printed wiring board according to claim 11, wherein each of the first top plating layer and the second top plating layer comprises metal including tin such that tin is a main component of the metal in each of the first top plating layer and the second top plating layer.

20. The method for manufacturing a printed wiring board according to claim 11, wherein the first opening and the second opening are formed such that the first opening has an aspect ratio of 0.5 or less and that the second opening has an aspect ratio of 0.6 or more.

* * * * *